(12) United States Patent
Katoh et al.

(10) Patent No.: US 7,012,029 B2
(45) Date of Patent: Mar. 14, 2006

(54) METHOD OF FORMING A LAMINATION FILM PATTERN AND IMPROVED LAMINATION FILM PATTERN

(75) Inventors: Tsuyoshi Katoh, Kagoshima (JP); Syuusaku Kido, Kagoshima (JP); Akitoshi Maeda, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 78 days.

(21) Appl. No.: 10/745,636

(22) Filed: Dec. 29, 2003

(65) Prior Publication Data

US 2004/0173567 A1 Sep. 9, 2004

(30) Foreign Application Priority Data

Dec. 25, 2002 (JP) ............................. 2002-375607

(51) Int. Cl.
*H01L 21/302* (2006.01)

(52) U.S. Cl. ...................... 438/738; 438/652; 438/654; 438/656; 438/735; 438/736

(58) Field of Classification Search ................ 438/652, 438/654, 656, 735, 736, 738
See application file for complete search history.

(56) References Cited

U.S. PATENT DOCUMENTS 5,968,850 A * 10/1999 Jeong et al. ................ 438/754
6,208,395 B1 * 3/2001 Kanoh et al. ................ 349/113
6,215,541 B1 * 4/2001 Song et al. .................. 349/141
6,297,519 B1 * 10/2001 Fujikawa et al. ............. 257/59
6,524,876 B1 * 2/2003 Baek et al. .................... 438/48

FOREIGN PATENT DOCUMENTS

| JP | 59-12419 | 1/1984 |
| JP | 1-120025 | 5/1989 |
| JP | 4-48733 | 2/1992 |
| JP | 4-155315 | 5/1992 |
| JP | 8-160450 | 6/1996 |
| JP | 9-189924 | 7/1997 |
| JP | 9-292630 | 11/1997 |

* cited by examiner

*Primary Examiner*—Christian D. Wilson
*Assistant Examiner*—Douglas Menz
(74) *Attorney, Agent, or Firm*—Young & Thompson

(57) ABSTRACT

In a method of forming an electrically conductive lamination pattern, an insulating film is formed on a surface of a chromium-containing bottom layer, before an aluminum-containing top layer is formed over the insulating film, so that the insulating film separates the aluminum-containing top layer from the chromium-containing bottom layer. A first selective wet etching process is carried out for selectively etching the aluminum-containing top layer with a first etchant. A second selective wet etching process is carried out for selectively etching the chromium-containing bottom layer with a second etchant in the presence the insulating film which suppresses a hetero-metal-contact-potential-difference between the chromium-containing bottom layer and the aluminum-containing top layer during the second selective wet etching process.

25 Claims, 21 Drawing Sheets

FIG. 7

| B \ A | 2 | 8 | 1 2 | 1 6 | 2 4 |
|---|---|---|---|---|---|
| 2 | × | × | × | △ | ○ |
| 4 | × | × | △ | □ | ○ |
| 8 | × | △ | □ | ○ | ○ |
| 1 2 | × | □ | ○ | ○ | — |
| 1 6 | □ | ○ | ○ | — | — |

( $\theta$  ×:80°~90° , △:60° , □:45° , ○:30° )

phosphorous acid concentration : 60 wt.-%
A : nitric acid concentration (wt.-%)
B : acetic acid concentration (wt.-%)

METHOD OF FORMING A LAMINATION FILM PATTERN AND IMPROVED LAMINATION FILM PATTERN

BACKGROUND OF THE INVENTION

1. Field of the Invention

The present invention relates to a method of forming a lamination film pattern and an improved lamination film pattern, and more particularly to a method of forming a metal lamination film pattern which comprises a first metal film comprising a refractory metal such as chromium or a chromium alloy, and a second; metal film overlying the first metal film and comprising aluminum or an aluminum alloy, wherein the method is free from any inhibition to etching for the first metal film of chromium or the chromium alloy, and also free from any peeling of a resist film from the metal lamination film due to over-time etching process.

2. Description of the Related Art

All of patents, patent applications, patent publications, scientific articles and the like, which will hereinafter be cited or identified in the present application, will, hereby, be incorporated by references in their entirety in order to describe more fully the state of the art, to which the present invention pertains.

A liquid crystal display has a plurality of switching devices, each of which comprises a thin film transistor (TFT), wherein any wiring delay appearing on a scanning line or a signal line causes a writing or crosstalk problem. In order to avoid this problem, the liquid crystal display, particularly to a large-scale and high-definition liquid crystal display, uses a low-resistive wiring for the scanning line or the signal line. In general, the low resistive wiring may comprise aluminum or an aluminum alloy. In the technical field of the liquid crystal display, in order to ensure a desired ohmic contact with a semiconductor layer and a transparent conductive film. The low resistive wiring may comprise a lamination structure of an aluminum or aluminum-alloy film and a refractory metal film. Typically, for example, the low resistive wiring may, comprise a double-layered structure of an aluminum layer and a refractory metal layer overlying the aluminum layer. The low resistive wiring may also comprise another double-layered structure of a refractory metal layer and an aluminum layer overlying the refractory metal layer. The low resistive wiring may also comprise a triple-layered structure of a first refractory metal layer, an aluminum layer overlying the first refractory metal layer, and a second refractory metal layer overlying the aluminum layer.

Japanese laid-open patent publication No. 4-155315 discloses a conventional method of forming an. Al/Cr lamination wiring, wherein an aluminum film overlies a chromium film. This method is applied to a thin film transistor array substrate. FIGS. 1A through 1D are fragmentary cross sectional elevation views illustrative of an Al/Cr lamination wiring over a substrate in sequential steps involved in the conventional method of forming the Al/Cr lamination wiring.

With reference to FIG. 1A, a first metal film 102 of chromium is formed over a substrate 101. A second metal film 103 of aluminum is then formed over the first metal film 102 of chromium, A desired resist pattern 104 is formed over the second metal film 103 of aluminum. A first etching process is taken place by using a first etchant and the resist pattern 104 as an etching mask for selectively etching the second metal film 103 of aluminum.

With reference to FIG. 1B, a second etching process is taken place by using a second etchant and the resist pattern 104 as the etching mask for selectively etching the first metal film 102 of chromium.

With reference to FIG. 1C, a third etching process as a side etching process is taken place by using the first etchant and the resist pattern 104 as the etching mask for selectively etching the side of the second metal film 103 of aluminum, so that the etched side edge of the second metal film 103 of aluminum is retracted by at least 0.5 micrometers from the side edge of the first metal film 102 of chromium.

With reference to FIG. 1D, the resist pattern 104 as used is then removed. Subsequently, a conductive film such as a pixel electrode is then formed, which extends over the second metal film 103 of aluminum and the substrate 101.

The third etching process as the side etching process is taken place in order to improve a step-coverage of the conductive film which extends over the second metal film 103 of aluminum and the substrate 101, resulting in improves in the yield and the quality of the thin film transistor (TFT) substrate.

The present inventors had experimentally confirmed the fact that the above-described conventional method of forming the lamination film pattern has the following disadvantages.

The rate of the second etching process is extremely low due to an inhibition to the second etching process for the first metal film 102 of chromium. Taking place the second etching process for a relatively long time period causes that an etchant for the second etching process be infiltrated into an interface between the resist pattern 104 and the second metal film 103 of aluminum, whereby the resist pattern 104 is peeled to contaminate an etching apparatus.

The present inventors had also estimated that the reason for the inhibition to the second etching process for the first metal film 102 of chromium is that a hetero-metal-contact-potential-difference between the first metal film 102 of chromium and the second metal film 103 of aluminum causes the etchant for etching the first metal film 102 of chromium to undesirably etch the second metal film 103 of aluminum.

In the above circumstances, the developments of a novel method of forming a lamination film pattern and of an improved lamination film pattern free from the above problems are desirable.

SUMMARY OF THE INVENTION

Accordingly, it is an object of the present invention to provide a novel method of forming a lamination film pattern free from the above problems.

It is a further object of the present invention to provide a novel method of forming a lamination film pattern free from any inhibition to the second etching process for a chromium containing film.

It is a still further object of the present invention to provide a novel method of forming a lamination film pattern free from any possible peeling phenomenon of the resist pattern due to any infiltration of the etchant on the ground of any over-time etching process for etching a chromium containing film.

It is yet a further object of the present invention to provide a novel lamination film pattern free from the above problems.

It is furthermore object of the present invention to provide a novel lamination film pattern free from any inhibition to the second etching process for a chromium containing film.

It is moreover object of the present invention to provide a novel lamination film pattern free from free from any possible peeling phenomenon of the resist pattern due to any infiltration of the etchant on the ground of any over-time etching process for etching a chromium containing film.

The present invention provides a method of forming an electrically conductive lamination pattern. The method includes the steps of: forming an insulating film on a surface of a chromium-containing bottom layer; forming an aluminum-containing top layer over the insulating film, so that the insulating film separates the aluminum-containing top layer from the chromium-containing bottom layer; carrying out a first selective wet etching process for selectively etching the aluminum-containing top layer with a first etchant; and carrying out a second selective wet etching process for selectively etching the chromium-containing bottom layer with a second etchant in the presence the insulating film which suppresses a hetero-metal-contact-potential-difference between the chromium-containing bottom layer and the aluminum-containing top layer during the second selective wet etching process.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 7 shows the dependency of a tapered angle of a tapered aluminum-neodymium (Al—Nd) alloy film wet-etched by an etchant, upon concentrations of nitric acid and acetic acid included in the etchant in addition to 60 percents by weight of phosphoric acid.

DETAILED DESCRIPTION OF THE PREFERRED EMBODIMENTS

Figure 1A:
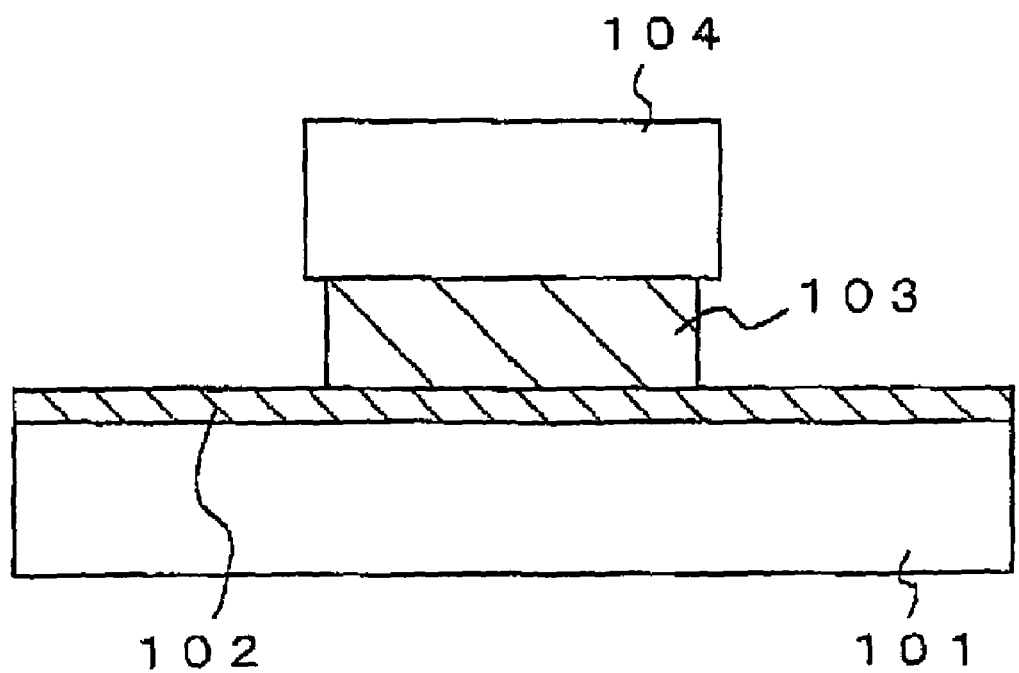
FIGS. 1A through 1D are fragmentary cross sectional elevation views illustrative of an Al/Cr lamination wiring over a substrate in sequential steps involved in the conventional method of forming the Al/Cr lamination wiring.
Figure 1B:
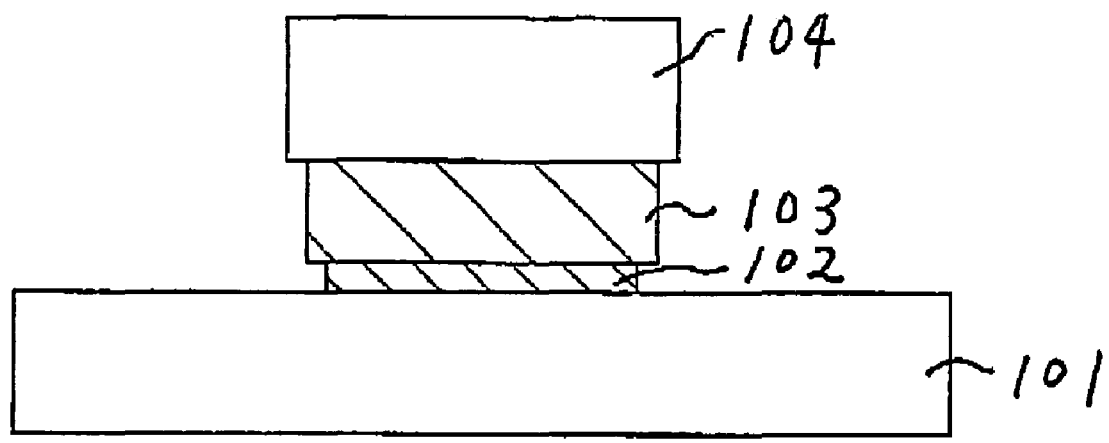
Figure 1C:
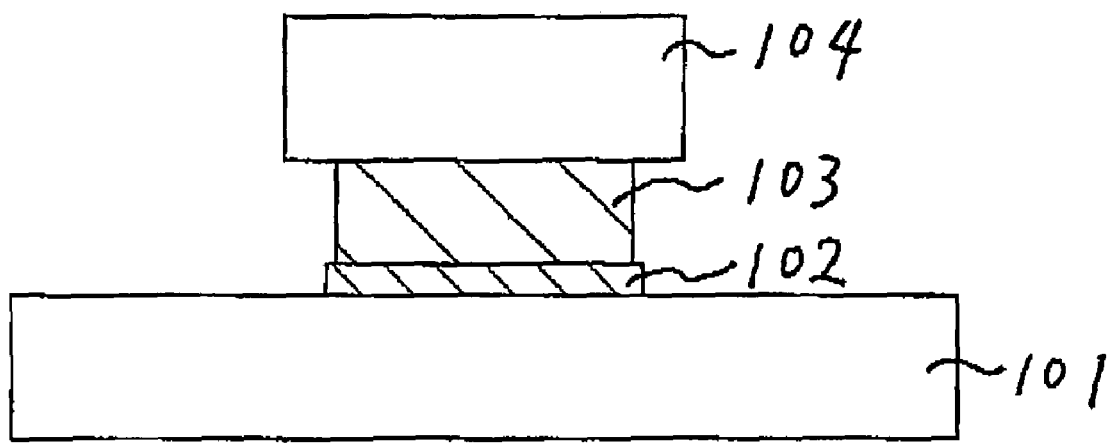
Figure 1D:
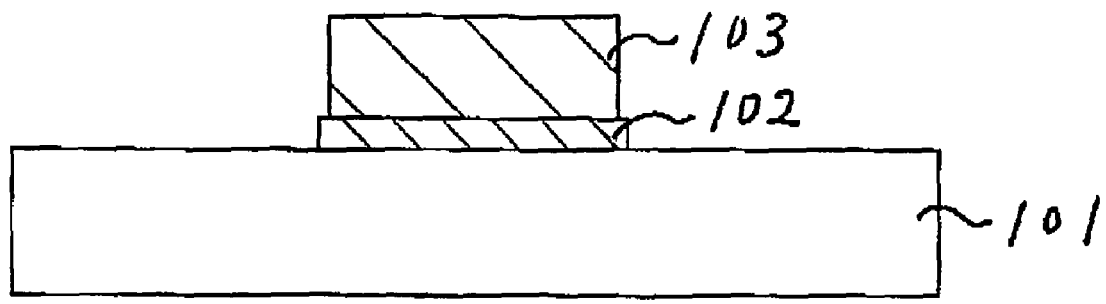

A first aspect of the present invention provides a method of forming an electrically conductive lamination pattern. The method includes the steps of: forming an insulating film on a surface of a chromium-containing bottom layer; forming an aluminum-containing top layer over the insulating film, so that the insulating film separates the aluminum-containing top layer from the chromium-containing bottom layer; carrying out a first selective wet etching process for selectively etching the aluminum-containing top layer with a first etchant; and carrying out a second selective wet etching process for selectively etching the chromium-containing bottom layer with a second etchant in the presence the insulating film which suppresses a hetero-metal-contact-potential-difference between the chromium-containing bottom layer and the aluminum-containing top layer during the second selective wet etching process.

It is preferable that the first selective wet etching process is carried out by using a resist pattern over the aluminum-containing top layer. It is more preferable to further include the step of removing the resist pattern after the first selective wet etching process has been completed, so that the second selective wet etching process is carried out by using, as a mask, the aluminum-containing top layer wet-etched in the first selective wet etching process.

It is also preferable that the insulating film comprises an oxide film formed by an oxidation process to the surface of the chromium-containing bottom layer. It is possible that the oxidation process to the surface of the chromium-containing bottom layer comprises an $O_2$ plasma process. Alternatively, it is possible that the oxidation process to the surface of the chromium-containing bottom layer comprises a reactive sputtering process. Further alternatively, it is also possible that the oxidation process to the surface of the chromium-containing bottom layer comprises an anneal process.

It is also preferable that the insulating film has a thickness in the range of 5 nanometers to 50 nanometers.

It is also preferable that the first etchant comprises a mixture of a phosphoric acid, a nitric acid and an acetic acid, where a sum of concentrations of the nitric acid and the acetic acid is at least 16 percents by weight.

It is also preferable to further include the step of carrying out a selective dry etching process, in addition to the second selective wet etching process, for selectively etching the chromium-containing bottom layer. It is also preferable to further include the step of removing a dry etching gas from a surface of the aluminum-containing top layer after the selective dry etching process using the dry etching gas has been completed.

It is also preferable that the chromium-containing bottom layer comprises one of a chromium layer and a chromium alloy layer, and the aluminum-containing top layer comprises one of an aluminum layer or an aluminum alloy layer.

It is also preferable that the electrically conductive lamination pattern is formed over a substrate for a liquid crystal display panel.

A second aspect of the present invention provides a method of forming an electrically conductive lamination pattern. The method includes the steps of: forming a chromium-containing bottom layer over a substrate; forming an aluminum-containing top layer over the insulating film, so that the insulating film separates the aluminum-containing top layer from the chromium-containing bottom layer; forming a resist pattern over the aluminum-containing top layer; carrying out a first selective wet etching process for selectively etching the aluminum-containing top layer with a first etchant and the resist pattern; removing the resist pattern from the aluminum-containing top layer; and carrying out a second selective wet etching process for selectively etching the chromium-containing bottom layer with a second etchant and by using, as a mask, the aluminum-containing top layer wet-etched.

It is preferable that the first etchant comprises a mixture of a phosphoric acid, a nitric acid and an acetic acid, where a sum of concentrations of the nitric acid and the acetic acid is at least 16 percents by weight.

It is also preferable to further include the step of forming an insulating film on a surface of the chromium-containing bottom layer before the aluminum-containing top layer is then formed, so that the second selective wet etching process is carried out in the presence the insulating film which suppresses a hetero-metal-contact-potential-difference between the chromium-containing bottom layer and the aluminum-containing top layer during the second selective wet etching process. It is further preferable that the insulating film comprises an oxide film formed by an oxidation process to the surface of the chromium-containing bottom layer. It is further preferable that the oxidation process to the surface of the chromium-containing bottom layer comprises an $O_2$ plasma process.

It is also preferable that the oxidation process to the surface of the chromium-containing bottom layer comprises a reactive sputtering process.

It is also preferable that the oxidation process to the surface of the chromium-containing bottom layer comprises an anneal process.

It is also preferable that the insulating film has a thickness in the range of 5 nanometers to 50 nanometers.

It is also preferable to further include the step of carrying out a selective dry etching process, in addition to the second selective wet etching process, for selectively etching the chromium-containing bottom layer. It is more preferable to further include the step of removing a dry etching gas from a surface of the aluminum-containing top layer after the selective dry etching process using the dry etching gas has been completed.

It is also preferable that the chromium-containing bottom layer comprises one of a chromium layer and a chromium alloy layer, and the aluminum-containing top layer comprises one of an aluminum layer or an aluminum alloy layer.

It is also preferable that the substrate is a thin film transistor substrate for a liquid crystal display.

A third aspect of the present invention provides an electrically conductive lamination pattern structure including: a chromium-containing bottom layer; an insulating film extending over a surface of the chromium-containing bottom layer; and an aluminum-containing top layer extending over the insulating film, so that the insulating film separates the aluminum-containing top layer from the chromium-containing bottom layer.

It is also preferable that the aluminum-containing top layer is tapered in cross sectional elevation shape. It is more preferable that edges of the chromium-containing bottom layer and the insulating film are aligned to or positioned inside of a tapered edge of the aluminum-containing top layer.

It is also preferable that the aluminum-containing top layer has a taper angle of at most approximately 60 degrees.

It is also preferable that the insulating film comprises an oxide film formed by an oxidation process to the surface of the chromium-containing bottom layer.

It is also preferable that the insulating film has a thickness in the range of 5 nanometers to 50 nanometers.

It is also preferable that the chromium-containing bottom layer comprises one of a chromium layer and a chromium alloy layer, and the aluminum-containing top layer comprises one of an aluminum layer or an aluminum alloy layer.

It is also preferable that the electrically conductive lamination pattern structure is formed over a substrate for a liquid crystal display panel. It is also preferable that the substrate is a thin film transistor substrate for the liquid crystal display panel.

A fourth aspect of the present invention provides a thin film transistor substrate for a liquid crystal display panel, the thin film transistor substrate including at least one electrically conductive lamination pattern structure further including: a chromium-containing bottom layer; an insulating film extending over a surface of the chromium-containing bottom layer; and an aluminum-containing top layer extending over the insulating film, so that the insulating film separates the aluminum-containing top layer from the chromium-containing bottom layer.

It is preferable that the aluminum-containing top layer is tapered in cross sectional elevation shape. It is more preferable that edges of the chromium-containing bottom layer and the insulating film are aligned to or positioned inside of a tapered edge of the aluminum-containing top layer.

It is also preferable that the aluminum-containing top layer has a taper angle of at most approximately 60 degrees.

It is also preferable that the insulating film comprises an oxide film formed by an oxidation process to the surface of the chromium-containing bottom layer.

It is also preferable that the insulating film has a thickness in the range of 5 nanometers to 50 nanometers.

It is also preferable that the chromium-containing bottom layer comprises one of a chromium layer and a chromium alloy layer, and the aluminum-containing top layer comprises one of an aluminum layer or an aluminum alloy layer.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

First Embodiment

A first embodiment according to the present invention will be described in detail with reference to the drawings. FIGS. 2A through 2G are fragmentary cross sectional elevation views illustrative of a novel method of forming a lamination film pattern in accordance with the first embodiment of the present invention.

Figure 2A:
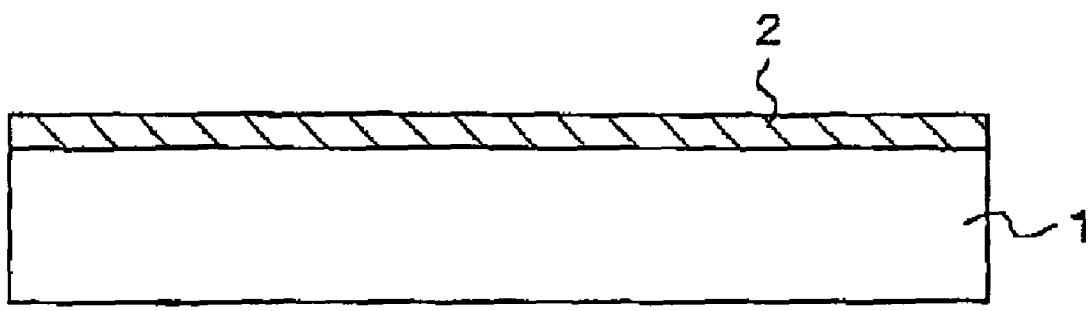
FIGS. 2A through 2G are fragmentary cross sectional elevation views illustrative of a novel method of forming a lamination film pattern in accordance with the first embodiment of the present invention.

With reference to FIG. 2A, a first metal film 2 is formed over a substrate 1. The first metal film 2 contains chromium. The first metal film 2 may, typically, comprise a chromium film or a chromium-alloy film, but should not be limited to these films. The first metal film 2 may also typically have a thickness of approximately 70 nanometers. The substrate 1 may include, but not limited to, a glass substrate and a semiconductor substrate. The method of forming the first metal film 2 may include, but not limited to, a sputtering method by using a sputtering system. In this case, the first metal film 2 is formed over the substrate 1 in a sputter chamber of the sputtering system.

Figure 2B:
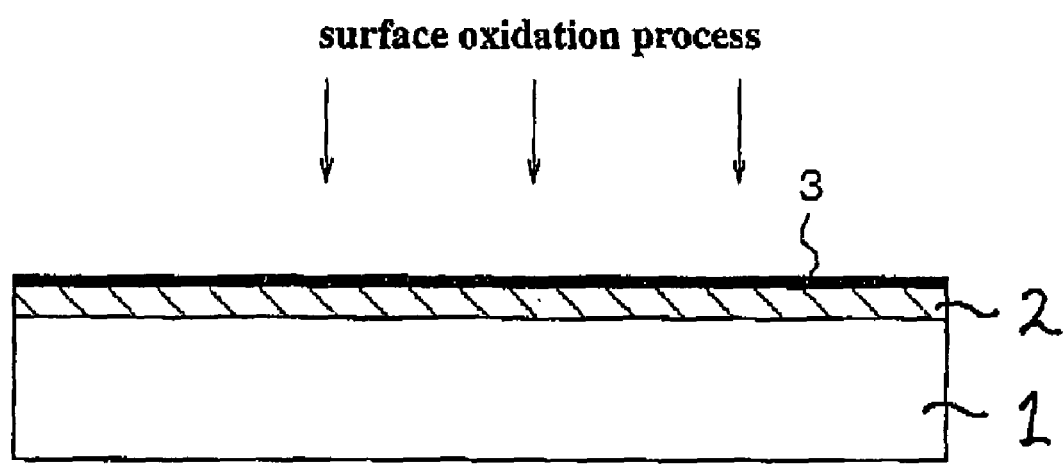

With reference to FIG. 2B, the substrate 1 with the first metal film 2 is taken out from the sputter chamber, provided that the first metal film 2 was formed by the sputtering method. An insulating film 3 is formed on a surface of the first metal film 2. The insulating film 3 may preferably comprise an oxide film. The oxide film 3 may typically have a thickness preferably in the range of 5 nanometers to 50 nanometers, and more preferably in the range of 10 nanometers to 50 nanometers. The oxide film 3 may be formed by a surface oxidation to a surface of the first metal film 2. The surface oxidation may be available, for example, by using a reactive sputtering process, an $O_2$ plasma process, or an anneal. Notwithstanding, it is preferable for this embodiment that the oxide film 3 may be formed by the $O_2$ plasma process using a dry-etch apparatus configured in a plasma-etch-mode.

Figure 2C:
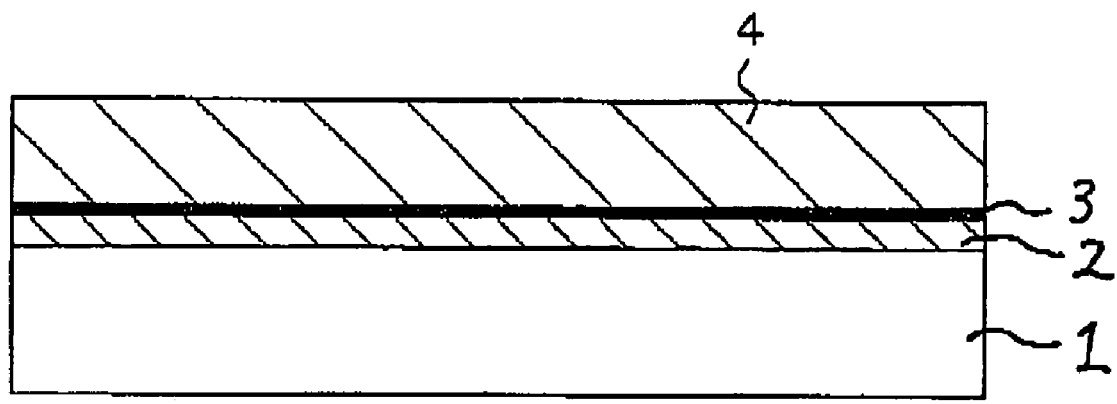

With reference to FIG. 2C, a second metal film 4 containing aluminum is formed on the insulating film 3 to form a lamination structure, which includes the first metal film 2, the insulating film 3, and the second metal film 4. The second metal film 4 is separated by the insulating film 3 from the first metal film 2, so that aluminum of the second metal film 4 is separated from chromium of the first metal film 2, whereby the presence of the insulating film 3 between the first metal film 2 and the second metal film 4 suppresses or reduces the above-described undesired hetero-metal-contact-potential-difference between the first metal film 2 and the second metal film 4. The second metal film 4 containing aluminum may, typically, comprise an aluminum film or an aluminum-alloy film, but should not be limited to these films. The second metal film 4 may also typically have a thickness of approximately 300 nanometers.

As described above, the preferable thickness of the oxide film 3 is in the range of 5 nanometers to 50 nanometers, and more preferably in the range of 10 nanometers to 50 nanometers. A much larger thickness than 50 nanometers of the oxide film 3 is not preferable in a point of view such that the larger thickness makes it difficult to reduce a resistivity of the lamination structure. A much smaller thickness than 5 nanometers of the oxide film 3 is also not preferable in another point of view such that the smaller thickness allows a possible appearance of the above-described undesired hetero-metal-contact-potential-difference between the first metal film 2 and the second metal film 4.

Figure 2D:
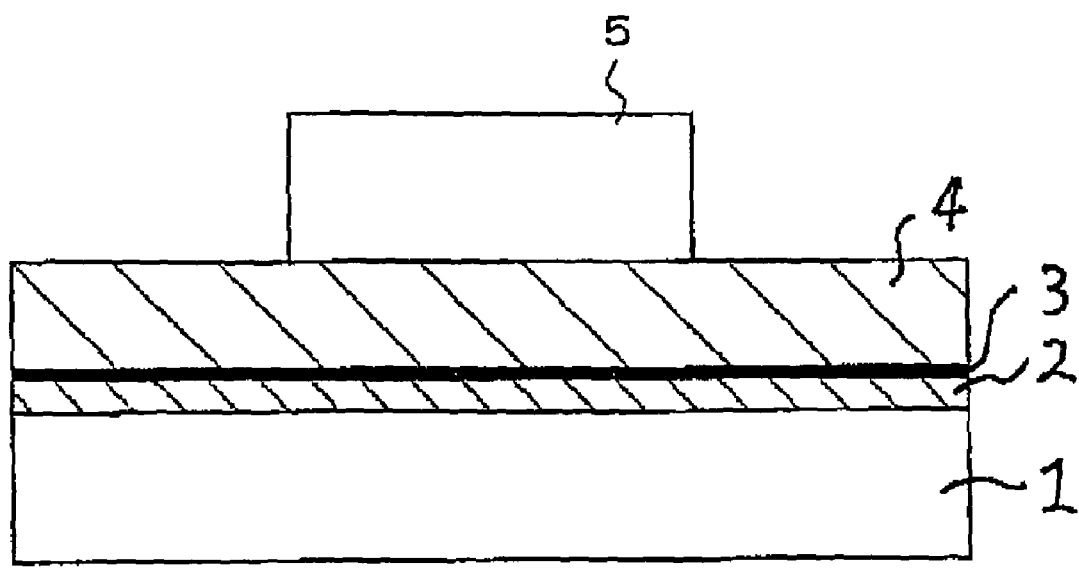

With reference to FIG. 2D, a resist film is applied on the second metal film 4 before lithography processes are then carried out so as to selectively form a resist mask 5 on the second metal film 4.

Figure 2E:
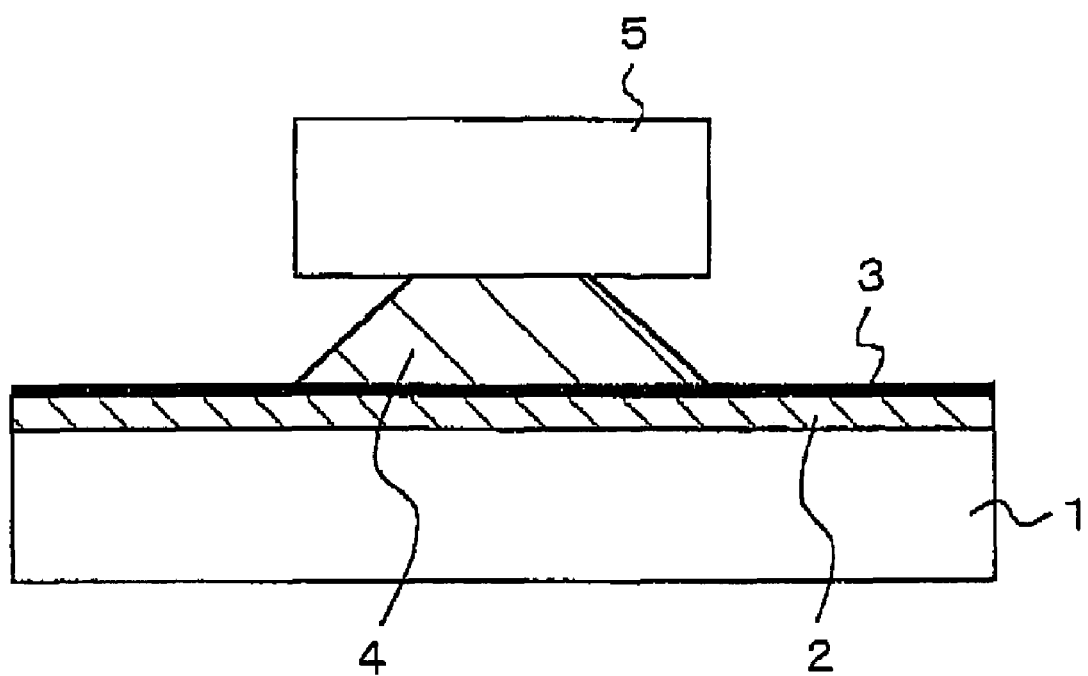

With reference to FIG. 2E, a first wet etching process is carried out for etching the second metal film 4 by use of the resist mask 5 and a first etchant. The first etchant may typically include a mixture of a phosphoric acid, an acetic acid and a nitric acid. The second metal film 4 is selectively etched thereby to shape a tapered second metal film 4 as well illustrated in this drawing. The tapered shape of the etched second metal film 4 may be adjusted by an adjustment to a compositional ratio of the first etchant. It is, however, preferable for the compositional ratio of the first etchant that the sum of both concentrations of the nitric acid and the acetic acid is at least 16 percents by weight. One example of the compositional ratio of the first etchant may be, but not limited to, that the etchant comprises 60 percents by weight of the phosphoric acid, 12 percents by weight of the acetic acid, and 12 percents by weight of the nitric acid, and 16 percents by weight of water.

Figure 2F:
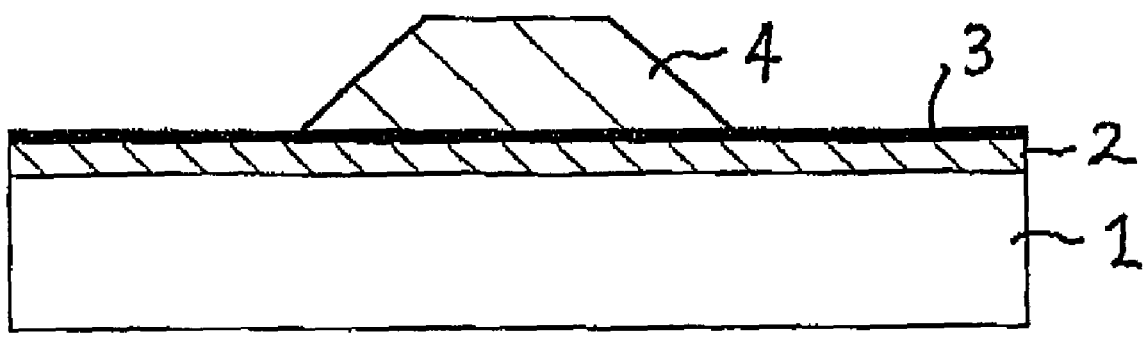

With reference to FIG. 2F, the used resist mask 5 is removed after the first etching process for etching the second metal film 4 has been completed.

Figure 2G:
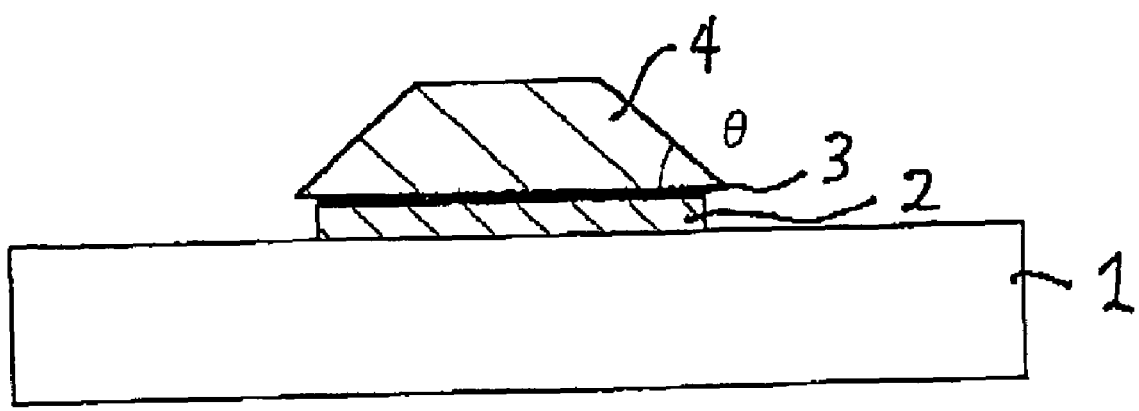

With reference to FIG. 2G, a second wet etching process is carried out for selectively etching the insulating film 3, for example, the oxide film 3 and the first metal film 2 by use of the tapered second metal film 4 as a mask and a second etchant. The second etchant may typically include a mixture of ammonium cerium nitrate and an nitric acid. The insulating film 3 and the first metal film 2 are selectively etched thereby to form a lamination film pattern, which comprises the etched first metal film 2, the etched insulating film 3 and the taper-etched second metal film 4 as well illustrated in FIG. 2G. It is preferable to avoid or possibly reduce any over-etching time of the second etching process for the first metal film 2 in order to avoid or suppress the first metal film 2 from being side-etched with reference to the edges of the second metal film 4.

The presence of the insulating film 3 between the first metal film 2 and the second metal film 4 suppresses or reduces the above-described undesired hetero-metal-contact-potential-difference between the first metal film 2 and the second metal film 4, resulting in almost no substantive inhibition to the second wet etching process for the first metal film 2.

After the first etching process for etching the second metal film 4 has been completed, the used resist mask 5 is then removed, before the second etching process for etching the insulating film 3 and the first metal film 2 will be made using the taper-etched second metal film 4 as the mask. This does not cause that the resist mask 5 is peeled by an undesired infiltration of the second etchant into an interface between the resist mask 5 and the second metal film 4 during the second etching process for etching the insulating film 3 and the first metal film 2.

As described above, the surface oxidation to the first metal film 2 may preferably be carried out by the $O_2$ plasma process. Examples of preferable conditions for carrying out the $O_2$ plasma process for the surface oxidation to the first metal film 2 may be as follows:
Etching mode: plasma etching mode;
Pressure: 133–260 (Pa);
$O_2$ flow rate: approximately 400 (scam);
Discharge power: 800–1500 (W); and
Discharge time: approximately 60 seconds.

Examples of preferable conditions for carrying out the first wet etching process for etching the second metal film 4 may be that the etching time is ranged from at least 0.5 times to less than 1 time of the necessary time for etching off an intended or targeted thickness for the etching by using the first etchant as deteriorated at that time.

Examples of preferable conditions for carrying out the second wet etching process for etching the first metal film 2 may be that the etching time is ranged from approximately 2 or 3 times of the necessary time for etching off an intended or targeted thickness for the etching by using the second etchant as deteriorated at that time.

Instead of the $O_2$ plasma process as described above, the reactive sputtering process and the anneal process are also available as the surface oxidation process for oxidizing the surface of the first metal film 2 containing chromium. The reactive sputtering process may be carried out by introducing $O_2$ gas in a predetermined final term of the sputtering process for forming the first metal film 2 containing chromium. The anneal may be carried out in the atmosphere. A natural oxidation of merely exposing the surface of the first metal film 2 to the atmosphere may result in a formation of an oxide film but which has a smaller thickness than the lower limit of the preferable thickness range as described above. For this reason, the natural oxidation is not suitable for forming the desired oxide film 3. A cleaning process and a peeling process are also may also result in a formation of an oxide film but which has a smaller thickness than the lower limit of the preferable thickness range as described above. For this reason, the cleaning process and the peeling process are also not suitable for forming the desired oxide film 3.

The above-described second etching process may comprise the wet etching process. Notwithstanding, the above-described second etching process may also comprise a combination of the wet etching process and a subsequent dry etching process. One typical example of the combined wet and dry etching processes will be described as follows.

A wet etching process as an initial etching process for isotropically etching the first metal film 2 containing chromium is carried out for a half-etching time ranged from approximately 1 or 1.5 times of the necessary time for etching off an intended or targeted thickness for the etching by using the second etchant as deteriorated at that time, whereby approximately one half thickness of the first metal film 2 is isotropically etched.

A dry etching process as a subsequent etching process for anisotropically etching the remaining part of the first metal film 2 containing chromium is carried out under the following conditions. A pressure is 40.0 Pa. Gas flow rates of $Cl_2/O_2$/He are 450/270/135 sccm. A discharge power is 1600 W. A total discharge time of a just-etching time and a subsequent over-etching time is 30 seconds.

An after-corrosion process is then carried out following to the last-described dry etching process, for the purpose of removing a chorine gas as adhered on the surface of the second metal film 4 containing aluminum during the last-mentioned dry etching process for the first metal film 2 containing chromium, thereby avoiding any undesired formation of a hydrochloric acid through a chemical reaction of the adhered chorine gas with a moisture of the air when the substrate is taken out from a dry etching chamber. The avoidance to the formation of the hydrochloric acid prevents any corrosion of the second metal film 4 containing aluminum.

The after-corrosion process may typically comprise the following first and second steps under different conditions.

The conditions for the first step are that the pressure is 6.67 Pa, the gas flow rates of $CF_4/O_2$ are 110/990 sccm, the discharge power is 0 W, and the discharge time is 70 seconds.

The conditions for the second step are that the pressure is 6.67 Pa, the gas flow rates of $CF_4/O_2$ are 80/720 sccm, the discharge power is 1000 W, and the discharge time is 60 seconds.

As described above, the presence of the insulating film 3 between the first metal film 2 and the second metal film 4 suppresses or reduces the above-described undesired hetero-metal-contact-potential-difference between the first metal film 2 and the second metal film 4, resulting in almost no substantive inhibition to the second wet etching process for the first metal film 2. After the first etching process for etching the second metal film 4 has been completed, the used resist mask 5 is then removed, before the second etching process for etching the insulating film 3 and the first metal film 2 will be made using the taper-etched second metal film 4 as the mask. This does not cause that the resist mask 5 is peeled by an undesired infiltration of the second etchant into an interface between the resist mask 5 and the second metal film 4 during the second etching process for etching the insulating film 3 and the first metal film 2.

The above-described novel method of forming the lamination film pattern in accordance with the present invention may be applicable to any devices which include at least one of such lamination film pattern. Typical examples of such the lamination film pattern may include, but not limited to, a gate electrode, a scanning line, source and drain electrodes and a signal line over a thin film transistor substrate of a liquid crystal display.

Figure 3:
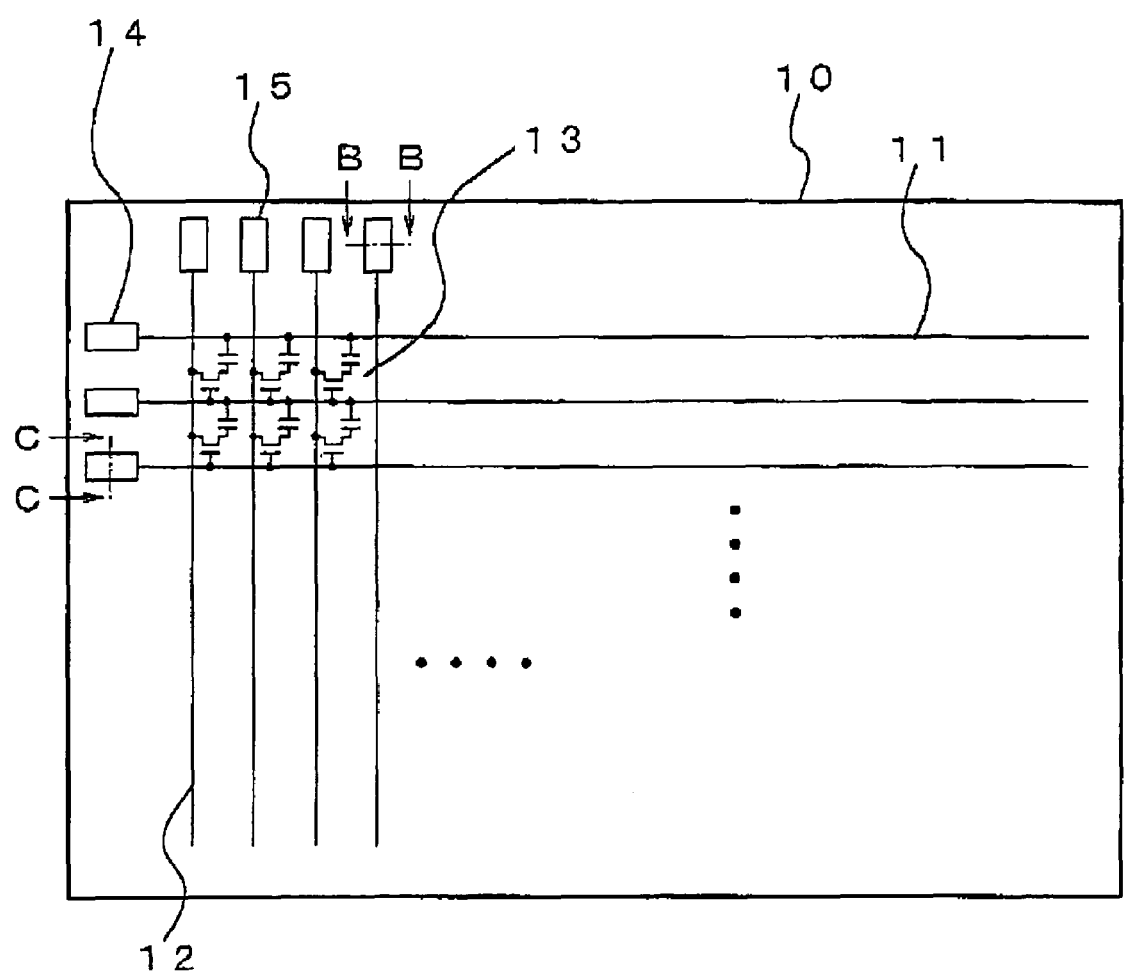
FIG. 3 is a schematic plan view illustrative of a thin film transistor substrate of a liquid crystal display.

FIG. 3 is a schematic plan view illustrative of a thin film transistor substrate of a liquid crystal display. A thin film transistor substrate 10 comprises a transparent insulating substrate, over which a plurality of scanning lines 11 run in a first horizontal direction and a plurality of signal lines 12 run in a second horizontal direction which may approximately be perpendicular to the first horizontal direction. The plurality of scanning lines 11 cross the plurality of signal lines 12 at approximately the right angle. A matrix array of plural switching devices are provided over the thin film transistor substrate 10, wherein the plurality of switching devices are positioned adjacent to crossing points of the plurality of scanning lines 11 and the plurality of signal lines 12. The plurality of switching devices are electrically connected to the plurality of scanning lines 11 and also electrically connected to the plurality of signal lines 12. Each of the plurality of switching devices may typically comprise a thin film transistor 13. Scanning line terminals 14 are provided at terminals of the scanning lines 11. Address signals are inputted into the scanning line terminals 14. Signal line terminals 15 are provided at terminals of the signal lines 12. Data signals are inputted into the signal line terminals 15, A matrix array of pixel electrodes are also provided over the thin film transistor substrate 10. A drain electrode of the thin film transistor 13 is electrically connected to the signal line 12. A gate electrode of the thin film transistor 13 is electrically connected to the scanning line 11. A source electrode of the thin film transistor 13 is electrically connected to the pixel electrode.

Figure 4:
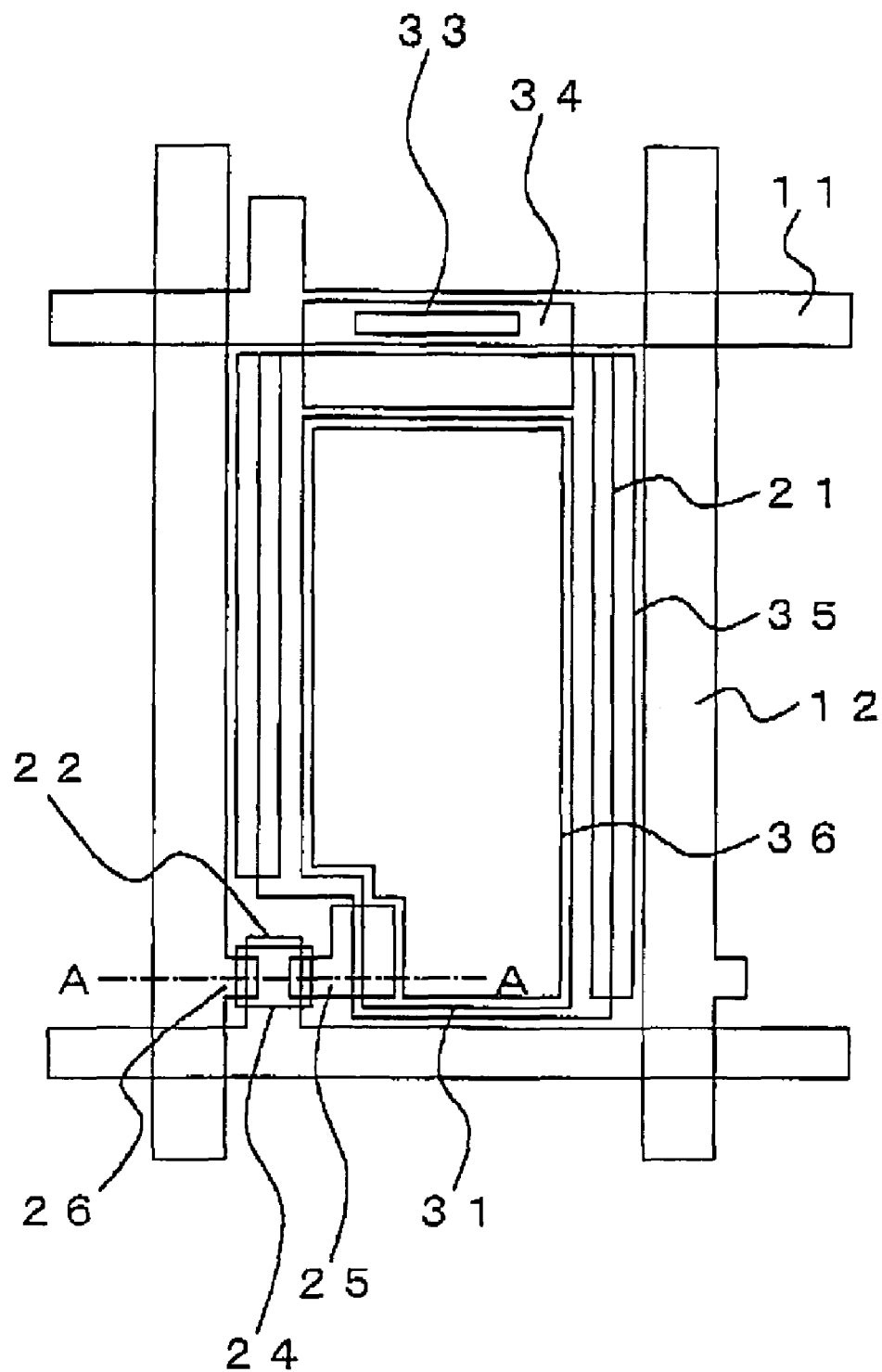
FIG. 4 is a fragmentary plan view illustrative of a single pixel structure of the thin film transistor substrate shown in FIG. 3.
Figure 5A:
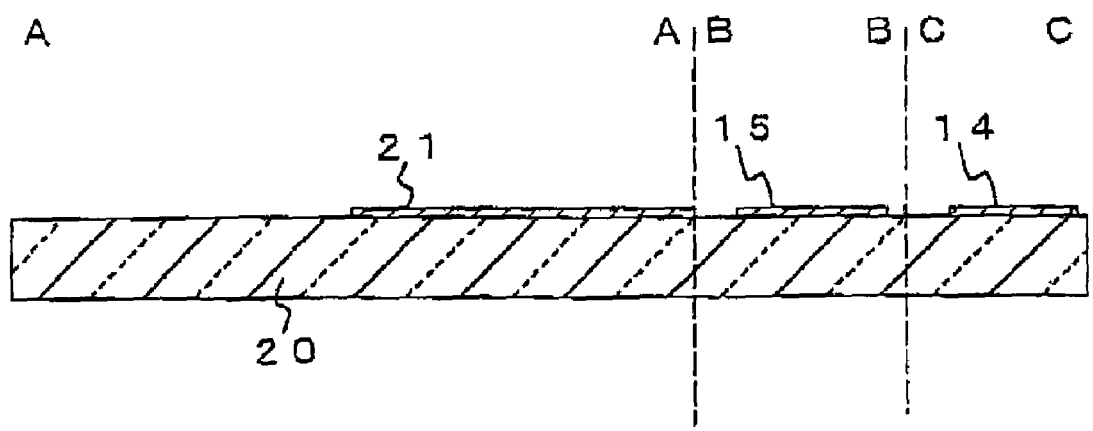
FIGS. 5A through 5F are fragmentary cross sectional elevation views illustrative of a novel method of forming a thin film transistor substrate shown in FIGS. 3 and 4, taken along an A—A line of FIG. 4 and a B—B line of FIG. 3 as well as a C—C line of FIG. 3.
Figure 5B:
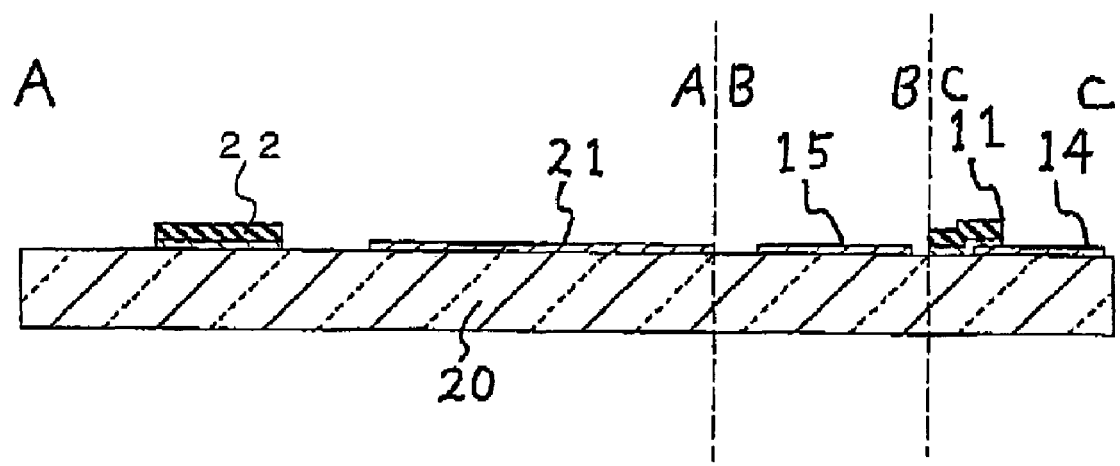
Figure 5C:
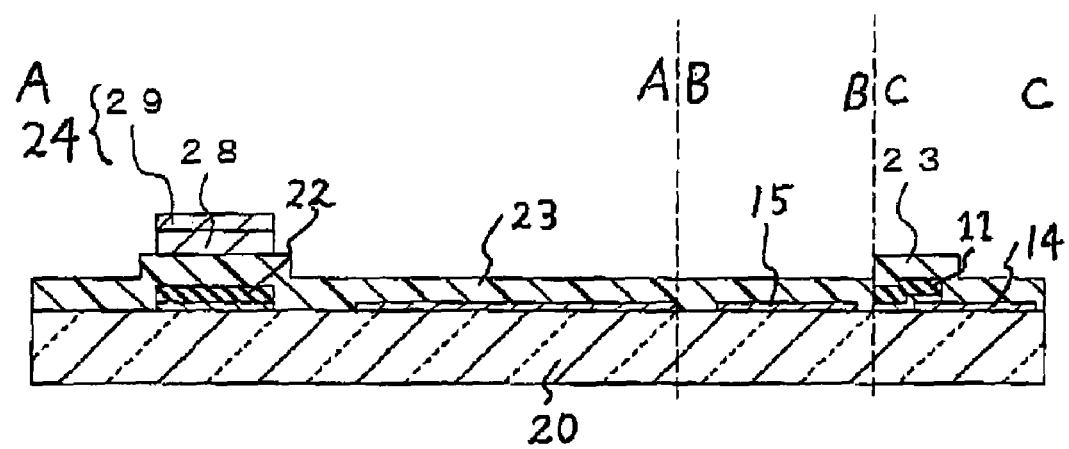
Figure 5D:
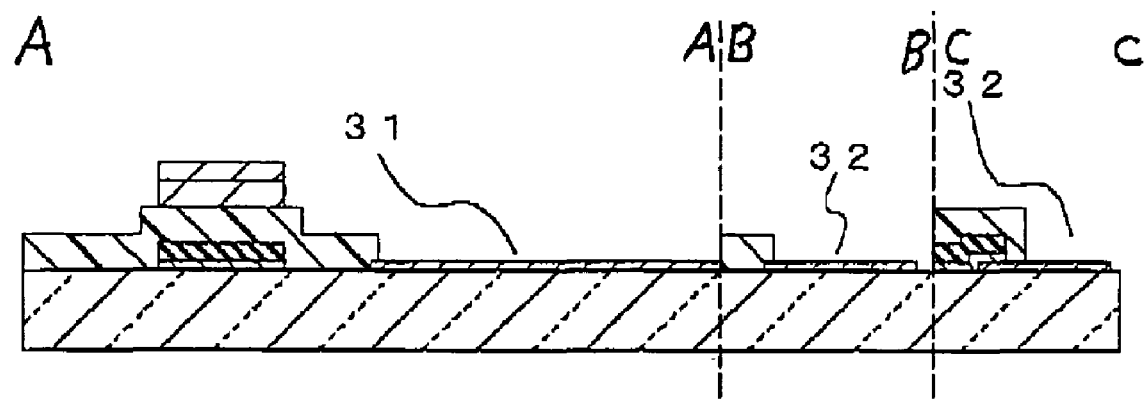
Figure 5E:
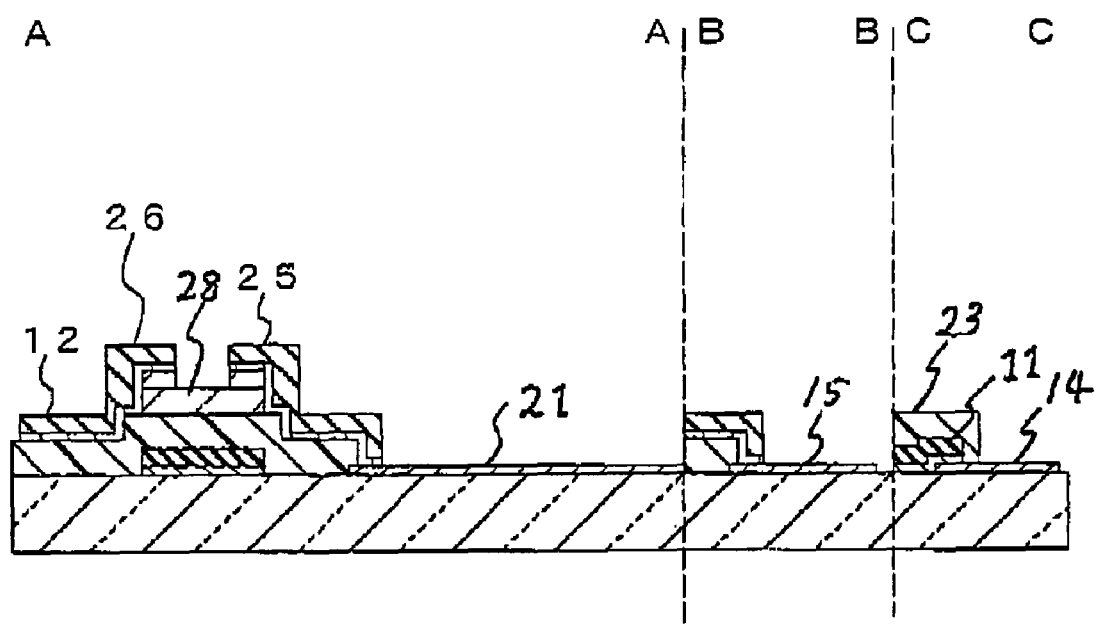

FIG. 4 is a fragmentary plan view illustrative of a single pixel structure of the thin film transistor substrate shown in FIG. 3. FIGS. 5A through 5F are fragmentary cross sectional elevation views illustrative of a novel method of forming a thin film transistor substrate shown in FIGS. 3 and 4, taken along an A—A line of FIG. 4 and a B—B line of FIG. 3 as well as a C—C line of FIG. 3. FIG. 6 is a fragmentary cross sectional elevation view illustrative of a liquid crystal display panel including in the thin film transistor substrate formed in the formation method shown in FIGS. 5A through 5F.

In accordance with this embodiment, the thin film transistor substrate comprises a reverse-staggered channel-etched thin film transistor which may be fabricated by using six masks.

Figure 5F:
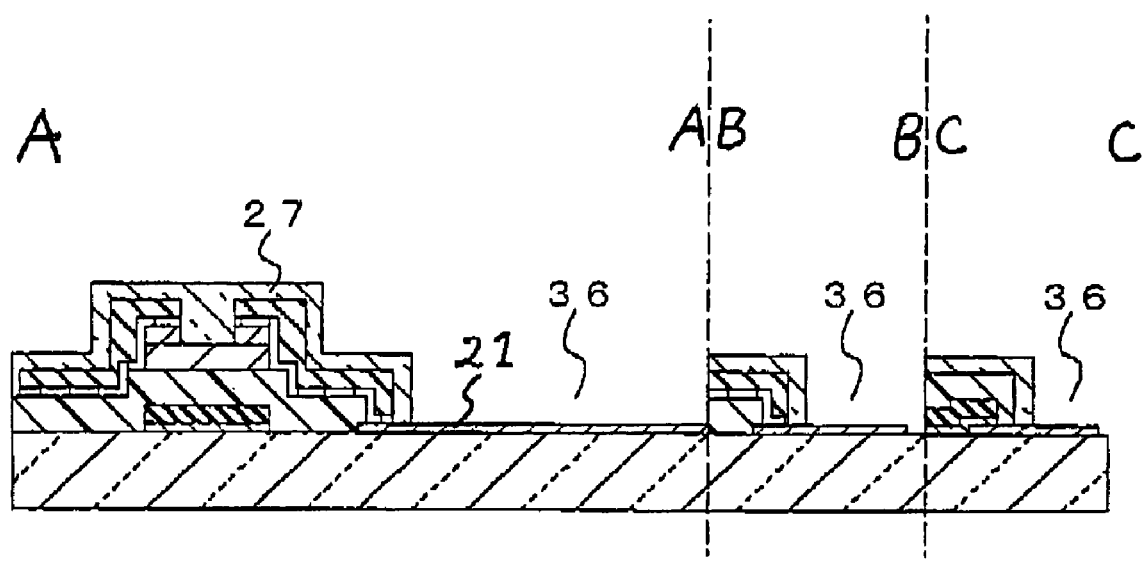
Figure 6:
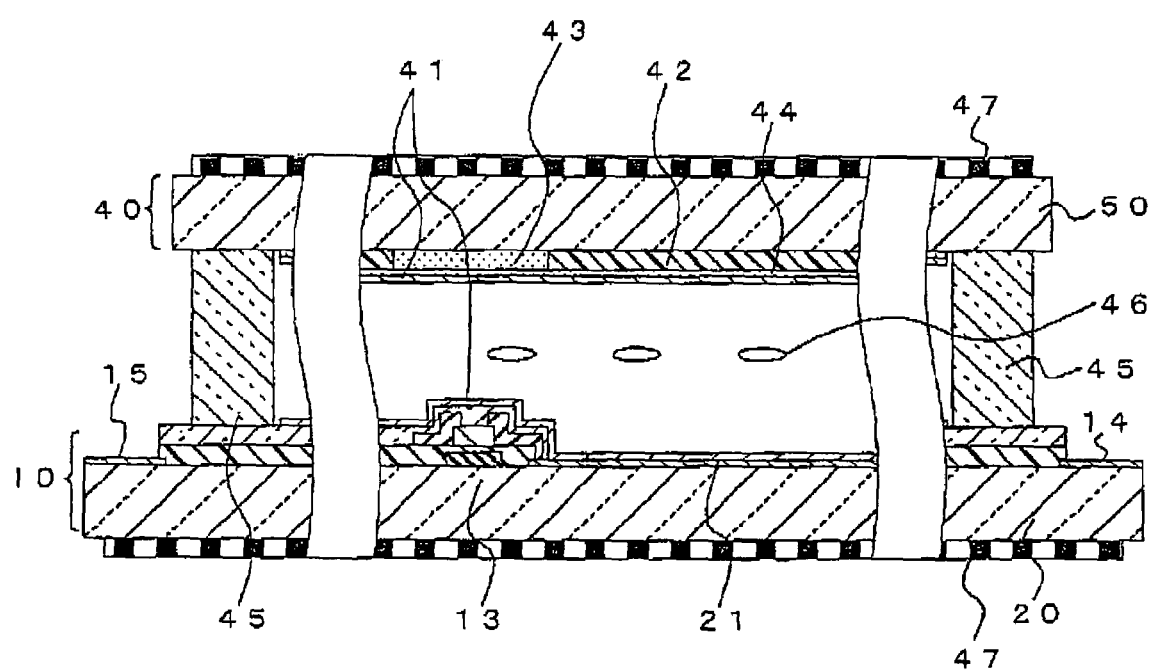
FIG. 6 is a fragmentary cross sectional elevation view illustrative of a liquid crystal display panel including in the thin film transistor substrate formed in the formation method shown in FIGS. 5A through 5F.

With reference to FIGS. 4 and 5F, each pixel structure is formed over a transparent insulating substrate 20. The each pixel structure is defined by a first pair of adjacent two of the scanning lines 11 and a second pair of adjacent two of the signal lines 12. The each pixel structure includes a pixel electrode 21, a gate electrode 22 connected to the scanning line 11, a gate insulating film 23 overlying the gate electrode 22 and the scanning line 11, a semiconductor layered structure 24 over the gate insulating film 23, and source and drain electrodes 25 and 26 partly over the semiconductor layered structure 24 as well as a storage capacitor electrode 34 and a pair of optical shielding layers 35. The source and drain electrodes 25 and 26 are separated from each other. A pixel contact hole 31 is formed over the pixel electrode 21. Terminal contact holes 32 are formed over the signal line terminal 15 and the scanning line terminal 14. A storage capacitor electrode contact hole 33 is also formed over the storage capacitor electrode 34. The signal line 12 extends over the gate insulating film 23. The signal line 12 is connected with the drain electrode 26. The storage capacitor electrode 34 is connected through the storage capacitor electrode contact hole 33 to the scanning line 11 on the previous stage. The thin film transistor comprises the gate electrode 22, the source electrode 25 and the drain electrode 26. Passivation films 27 extend over the thin film transistor and the optical shielding layers 35. Openings 36 are formed in the gate insulating film 23 and the passivation film 27, wherein the openings 36 extend inside the pixel contact hole 31 and the terminal contact holes 32. The source electrode 25 is electrically connected to the pixel electrode 21 through the pixel contact hole 31. The signal line terminal 15 is electrically connected to the terminal of the signal line 12 through the terminal contact hole 32. The storage capacitor electrode 34 and the pixel electrode 21 form a capacitor which is illustrated in FIG. 3.

The following descriptions with reference to FIGS. 5A through 5F and FIG. 6 will focus on a method of fabricating a liquid crystal display including a thin film transistor substrate, to which the method of forming the lamination film pattern is applied in accordance with the present invention.

The method of forming the thin film transistor substrate includes the following six steps. The first step is to form a pixel electrode over a transparent insulating substrate. The second step is to form a gate electrode and a scanning electrode. The third step is to form a gate insulating film and a semiconductor layered structure. The fourth step is to form contact holes. The fifth step is to form source and drain electrodes and a signal line. The sixth step is to form a passivation film and openings.

Each of the gate electrode, the scanning line, the source and drain electrodes and the signal line comprises a double-layered lamination pattern of a chromium-containing bottom layer and an aluminum-containing top layer, wherein an oxide layer is formed on a surface of the chromium-containing bottom layer, so that the aluminum-containing top layer is separated from the chromium-containing bottom layer by the oxide layer.

The aluminum-containing top layer is selectively etched by using a resist mask, and then the resist mask is removed before the chromium-containing bottom layer is selectively etched by using the selectively etched aluminum-containing top layer as a mask, thereby to form a double-layered lamination pattern.

With reference to FIG. 5A, a transparent conductive film is formed over a transparent insulating substrate 20 by a sputtering method. The transparent insulating substrate 20 may typically comprise a non-alkali glass having a thickness of 0.7 millimeters. The transparent conductive film may have a thickness of 50 nanometers. The transparent conductive film may typically comprise either an indium tin oxide film or an indium zinc oxide film. The transparent conductive film is then subjected to a lithography process and a subsequent selective etching process for patterning the transparent conductive film, thereby to make the transparent conductive film into a pixel electrode 21, a scanning electrode terminal 14 and a signal electrode terminal 15.

With reference to FIG. 5B, a chromium-containing bottom layer is formed, by a sputtering method, over the transparent insulating substrate 20 as well as over the pixel electrode 21, the scanning electrode terminal 14 and the signal electrode terminal 15. The chromium-containing bottom layer may typically comprise either a chromium layer or a chromium-alloy layer. The chromium-containing bottom layer may typically have a thickness of approximately 70 nanometers. Preferable examples of the chromium alloy layer may include, but not limited to, a chromium molybdenum layer or a chromium nitride layer.

The transparent insulating substrate 20 is then taken out from the sputter chamber. An insulating film is formed on a surface of the chromium-containing bottom layer. The insulating film may preferably comprise an oxide film. The oxide film may typically have a thickness preferably in the range of 5 nanometers to 50 nanometers, and more preferably in the range of 10 nanometers to 50 nanometers. The oxide film may be formed by a surface oxidation to a surface of the chromium-containing bottom layer. The surface oxidation may be available, for example, by using a reactive sputtering process, an $O_2$ plasma process, or an anneal. Notwithstanding, it is preferable for this embodiment that the oxide film may be formed by the $O_2$ plasma process using a dry-etch apparatus configured in a plasma-etch-mode.

An aluminum-containing top layer is formed, by a sputtering method, over the oxide film on the surface of the chromium-containing bottom layer, whereby a lamination structure is formed, which comprises a double-layered structure of the chromium-containing bottom layer and the aluminum-containing top layer, both of which are separated by the oxide film formed on the surface of the chromium-containing bottom layer. The aluminum-containing top layer may typically have a thickness of approximately 300 nanometers. The aluminum-containing top layer may typically comprise either an aluminum layer or an aluminum alloy layer. Preferable examples of the aluminum alloy layer may include, but not limited to, an aluminum-copper layer and an aluminum-neodymium.

The lamination structure is then subjected to a lithography process and a subsequent selective etching process for patterning the lamination structure, thereby to make the lamination structure into a gate electrode 22 and a scanning line not illustrated in FIG. 5B. The lithography process and the subsequent selective etching process are as follows.

A resist film is applied on the aluminum-containing top layer before lithography processes are then carried out so as to selectively form a resist mask on the aluminum-containing top layer.

A first wet etching process is carried out for etching the aluminum-containing top layer by use of the resist mask and a first etchant. The first etchant may typically include a mixture of a phosphoric acid, an acetic acid and a nitric acid. The aluminum-containing top layer is selectively etched thereby to shape a tapered aluminum-containing top layer, The tapered shape of the etched aluminum-containing top layer may be adjusted by an adjustment to a compositional ratio of the first etchant. It is, however, preferable for the compositional ratio of the first etchant that the sum of both concentrations of the nitric acid and the acetic acid is at least 16 percents by weight. One example of the compositional ratio of the first etchant may be, but not limited to, that the etchant comprises 60 percents by weight of the phosphoric acid, 12 percents by weight of the acetic acid, and 12 percents by weight of the nitric acid, and 16 percents by weight of water.

The used resist mask is removed after the first etching process for etching the aluminum-containing top layer has been completed.

A second wet etching process is carried out for selectively etching the oxide film and the chromium-containing bottom layer by use of the tapered aluminum-containing top layer as a mask and a second etchant. The second etchant may typically include a mixture of ammonium cerium nitrate and a nitric acid. The oxide film and the chromium-containing bottom layer are selectively etched thereby to form the gate electrode 22 and the scanning line which comprise lamination film patterns, each of which comprises the etched chromium-containing bottom layer, the etched oxide film and the taper-etched aluminum-containing top layer. It is preferable to avoid or possibly reduce any over-etching time of the second etching process for the chromium-containing bottom layer in order to avoid or suppress the chromium-containing bottom layer from being side-etched with reference to the edges of the taper-etched aluminum-containing top layer.

The presence of the oxide film between the chromium-containing bottom layer and the aluminum-containing top layer suppresses or reduces the above-described undesired hetero-metal-contact-potential-difference between the chromium-containing bottom layer and the aluminum-containing top layer, resulting in almost no substantive inhibition to the second wet etching process for the chromium-containing bottom layer.

After the first etching process for etching the aluminum-containing top layer has been completed, the used resist mask is then removed, before the second etching process for etching the oxide film and the chromium-containing bottom layer will be made using the taper-etched aluminum-containing top layer as the mask. This does not cause that the resist mask is peeled by an undesired infiltration of the second etchant into an interface between the resist mask and the aluminum-containing top layer during the second etching process for etching the oxide film and the chromium-containing bottom layer.

With reference to FIG. 5C, a gate insulating film 23 is entirely formed, by a plasma enhanced chemical vapor deposition method, over the transparent insulating substrate 20, the gate electrode 22, the pixel electrode 21, the signal line terminal 15, the scanning line terminal 14 and the scanning line. The gate insulating film 23 may typically comprise a silicon nitride film. The gate insulating film 23 may typically have a thickness of approximately 400 nanometers. An undoped amorphous silicon layer 28 is also formed, by a plasma enhanced chemical vapor deposition method, over the gate insulating film 23. The undoped amorphous silicon layer 28 may typically have a thickness of approximately 200 nanometers. A phosphorous-doped amorphous silicon layer 29 is also formed, by a plasma enhanced chemical vapor deposition method, over the undoped amorphous silicon layer 28, thereby to form a double-layered amorphous silicon structure. The double-layered amorphous silicon structure is then subjected to a lithography process and a subsequent etching process for patterning the double-layered amorphous silicon structure, thereby making the double-layered amorphous silicon structure into a semiconductor layer 24. The semiconductor layer 24 extends over the gate insulating film 23 and is positioned over the gate electrode 22.

With reference to FIG. 5D, a pixel contact hole 31, terminal contact holes 32 and a storage capacitor electrode contact hole 33 are formed in the gate insulating film 23. The pixel contact hole 31 is positioned over the pixel electrode 21. The terminal contact holes 32 are positioned over the canning line terminal 14 and the signal line terminal 15. The storage capacitor electrode contact hole 33 is positioned over the scanning line 11.

With reference to FIG. 5E, a source electrode 25, a drain electrode 26 and a signal line 12 are formed in the same processes as described above in accordance with the present invention. Namely, a chromium-containing bottom layer is formed, by a sputtering method, over the semiconductor layer 24 and the gate insulating film 23 as well as over the pixel contact hole 31, the terminal contact holes 32 and the storage capacitor electrode contact hole 33. The chromium-containing bottom layer may typically comprise either a chromium layer or a chromium-alloy layer. The chromium-containing bottom layer may typically have a thickness of approximately 70 nanometers. Preferable examples of the chromium alloy layer may include, but not limited to, a chromium molybdenum layer or a chromium nitride layer.

The transparent insulating substrate 20 is then taken out from the sputter chamber. An insulating film is formed on a surface of the chromium-containing bottom layer. The insulating film may preferably comprise an oxide film. The oxide film may typically have a thickness preferably in the range of 5 nanometers to 50 nanometers, and more preferably in the range of 10 nanometers to 50 nanometers. The oxide film may be formed by a surface oxidation to a surface of the chromium-containing bottom layer. The surface oxidation may be available, for example, by using a reactive sputtering process, an $O_2$ plasma process, or an anneal. Notwithstanding, it is preferable for this embodiment that the oxide film may be formed by the $O_2$ plasma process using a dry-etch apparatus configured in a plasma-etch-mode.

An aluminum-containing top layer is formed, by a sputtering method, over the oxide film on the surface of the chromium-containing bottom layer, whereby a lamination structure is formed, which comprises a double-layered structure of the chromium-containing bottom layer and the aluminum-containing top layer, both of which are separated by the oxide film formed on the surface of the chromium-containing bottom layer. The aluminum-containing top layer may typically have a thickness of approximately 200 nanometers. The aluminum-containing top layer may typically comprise either an aluminum layer or an aluminum alloy layer. Preferable examples of the aluminum alloy layer may include, but not limited to, an aluminum-copper layer and an aluminum-neodymium.

The lamination structure is then subjected to a lithography process and a subsequent selective etching process for patterning the lamination structure, thereby to make the lamination structure into a source electrode 25, a drain electrode 26 and a signal electrode 12. The lithography process and the subsequent selective etching process are as follows.

A resist film is applied on the aluminum-containing top layer before lithography processes are then carried out so as to selectively form a resist mask on the aluminum-containing top layer.

A first wet etching process is carried out for etching the aluminum-containing top layer by use of the resist mask and a first etchant. The first etchant may typically include a mixture of a phosphoric acid, an acetic acid and a nitric acid. The aluminum-containing top layer is selectively etched thereby to shape a tapered aluminum-containing top layer. The tapered shape of the etched aluminum-containing top layer may be adjusted by an adjustment to a compositional ratio of the first etchant. It is, however, preferable for the compositional ratio of the first etchant that the sum of both concentrations of the nitric acid and the acetic acid is at least 16 percents by weight. One example of the compositional ratio of the first etchant may be, but not limited to, that the etchant comprises 60 percents by weight of the phosphoric acid, 12 percents by weight of the acetic acid, and 12 percents by weight of the nitric acid, and 16 percents by weight of water.

The used resist mask is removed after the first etching process for etching the aluminum-containing top layer has been completed.

A second wet etching process is carried out for selectively etching the oxide film and the chromium-containing bottom layer by use of the tapered aluminum-containing top layer as a mask and a second etchant. The second etchant may typically include a mixture of ammonium cerium nitrate and a nitric acid. The oxide film and the chromium-containing bottom layer are selectively etched thereby to form the gate electrode 22 and the scanning line which comprise lamination film patterns, each of which comprises the etched chromium-containing bottom layer, the etched oxide film and the taper-etched aluminum-containing top layer. It is preferable to avoid or possibly reduce any over-etching time of the second etching process for the chromium-containing bottom layer in order to avoid or suppress the chromium-containing bottom layer from being side-etched with reference to the edges of the taper-etched aluminum-containing top layer.

The second wet etching process may be carried out in combination with a dry etching process. It is, however, preferable as described above, the second wet etching process may be carried out solely because an after-corrosion process subsequent to the dry etching process may provide a damage to the semiconductor layer 24 and the gate insulating film 23.

In order to avoid or prevent any corrosion of the aluminum-containing top layer due to an etching gas in a later process for forming a channel, it is preferable that either after the first wet etching process for the aluminum-containing top layer has been completed or after the resist mask has been removed, then a water cleaning process is carried out using a hot water of a temperature in the range of approximately 40° C. to approximately 50° C., and further a protection film is formed on the upper surface and the side faces of the aluminum-containing top layer. The protection film may typically comprise either an oxide film or a hydroxide film. A preferable thickness of the protection film may depend upon a temperature of the hot water. A typical example of the preferable thickness of the protection film may be ranged from 200 nanometers to 300 nanometers.

The presence of the oxide film between the chromium-containing bottom layer and the aluminum-containing top layer suppresses or reduces the above-described undesired hetero-metal-contact-potential-difference between the chromium-containing bottom layer and the aluminum-containing top layer, resulting in almost no substantive inhibition to the second wet etching process for the chromium-containing bottom layer.

After the first etching process for etching the aluminum-containing top layer has been completed, the used resist mask is then removed, before the second etching process for etching the oxide film and the chromium-containing bottom layer will be made using the taper-etched aluminum-containing top layer as the mask. This does not cause that the resist mask is peeled by an undesired infiltration of the second etchant into an interface between the resist mask and the aluminum-containing top layer during the second etching process for etching the oxide film and the chromium-containing bottom layer.

With still reference to FIG. 5E, a part of the phosphorous-doped amorphous silicon layer 29 exposed through a gap between the source electrode 25 and the drain electrode 26 is then etched by an etching process. This etching process may typically comprise a dry etching process. Typical examples of the dry etching process may include, but not limited to, a plasma etching process and a reactive ion etching process. In each of the plasma etching process and the reactive ion etching process, typical examples of the etching gas may include, but not limited to, fluorine-containing gases used solely, or in combination with chlorine-containing gases which exclude a pure chlorine gas. For example, there is available nother mixture gas of sulfur hexafluoride ($SF_6$), hydrochloric acid (HCl) and helium (He). In two-steps etching process, there is available a mixture gas of methane trifluoride ($CHF_3$), oxygen ($O_2$) and helium (He) used in combination with the above-described mixture gas of sulfur hexafluoride ($SF_6$), hydrochloric acid (HCl) and helium (He). In two-steps etching process, there is also available the above-described mixture gas of methane trifluoride ($CHF_3$), oxygen ($O_2$) and helium (He) used in combination with still another mixture gas of sulfur hexafluoride ($SF_6$), methane trifluoride ($CHF_3$) and helium (He). The reason why the pure chlorine gas is excluded is to suppress the corrosion of the aluminum-containing top layer.

The presence of the above-described protection layer over the aluminum-containing top layer prevents the aluminum-containing top layer from exposure to a plasma of the above-described etching gas.

After the above-described dry etching process has been made, then the dry etching chamber is vacuumed, wherein the substrate 20 is preferably separated from the electrode, so as to remove any etching gases adhered on a bottom surface of the substrate.

After the vacuum process has been made, then some residues of fluorine and chlorine might be presented in the vacuumed chamber. A plasma process is carried out in the vacuumed chamber by using either gas of oxygen ($O_2$), nitrogen ($N_2$), hydrogen ($H_2$) and helium (He), whereby the plasma process substitutes the residues of fluorine and chlorine. If the residues of fluorine and chlorine are not removed from the surface of the substrate 20, while the substrate 20 is carried to or exposed to an atmosphere, then the residues of fluorine and chlorine on the substrate 20 show a chemical reaction with moisture of the atmosphere, thereby forming hydrofluoric acid (HF) and hydrochloric acid (HCl), resulting in a corrosion of the aluminum-containing top layer. The above-described method in accordance with the present invention prevents the aluminum-containing top layer from exposure to the plasma gas acting as the etching gas, and also remove the residues of fluorine and chlorine on the substrate 20, resulting in no corrosion of the aluminum-containing top layer.

With reference to FIG. 5F, a passivation film 27 is entirely formed, by a plasma enhanced chemical vapor deposition method, over the source electrode 25, the drain electrode 26, the signal line 12, the scanning line 11, the pixel electrode 21, the signal line terminal 15, the scanning line terminal 14, the gate insulating film 23 and a part of the undoped amorphous silicon layer 28. The passivation film 27 may typically comprise a silicon nitride film. A typical thickness of the passivation film 27 my be, but not limited to, approximately 200 nanometers. The passivation film 27 is then subjected to a lithography process and a subsequent etching process, to form openings 36 over the pixel electrode 21, the signal line terminal 15, and the scanning line terminal 14. Finally, an anneal is made at a temperature of approximately 270° C. to complete the thin film transistor substrate.

The insulating layer, typically the oxide layer, formed on the surface of the chromium-containing bottom layer may preferably be so thin as to have a thickness ranged from 5 nanometers to 50 nanometers. Further, address signals and data signals are generated by AC-drive. Alternating currents as the address signals and data signals flow both the aluminum-containing top layer and the chromium-containing bottom layer.

Even if the above-described counter-measure is not made to suppress the chromium-containing bottom layer from being side-etched with reference to the edges of the taper-etched aluminum-containing top layer, then both the tapered-shape of the etched aluminum-containing top layer and the thicker thickness of the aluminum-containing top layer than the chromium-containing bottom layer cause no problem with coverage of the overlying gate insulating film and the overlying passivation film.

The following descriptions with reference to FIG. 6 will focus on the subsequent processes for forming the liquid crystal display from the thin film transistor substrate.

A first orientation film 41 is formed, by a printing method, over the above-described thin film transistor substrate 10. A typical thickness of the first orientation film 41 may be, but not limited to, approximately 50 nanometers. The first orientation film 41 is then sintered or baked at approximately 220° C. A first orientation process is carried out to the first orientation film 41, so that the first orientation film 41 has a first orientation.

An opposite substrate 40 is formed, which faces to the above-described thin film transistor substrate 10. The opposite substrate 40 includes a transparent insulating substrate 50, a color filter 42, a black matrix 43 and a common electrode 44. The transparent insulating substrate 50 may typically comprise, but not limited to, a non-alkali glass having a thickness of 0.7 millimeters. The color filter 42, the black matrix 43 and the common electrode 44 are formed over the transparent insulating substrate 50. The color filter 42 of the opposite substrate 40 is so aligned, in the plan view, as corresponding to the thin film transistor 13 of the thin film transistor substrate 10. The black matrix 43 is so aligned, in the plan view, as corresponding to a peripheral region of a pixel region which includes the thin film transistor 13. The common electrode 44 covers the color filter 42 and the black matrix 43, which are formed on the surface of the transparent insulating substrate 50. The common electrode 44 may typically comprise a transparent conductive film such as indium tin oxide. As a top layer of the opposite substrate 40, a second orientation film 41 is formed by a printing method, which covers the common electrode 44. A typical thickness of the second orientation film 41 may be, but not limited to, 50 nanometers. The second orientation film 41 is then sintered or baked at a temperature of approximately 220° C. The thin film transistor substrate 10 and the opposite substrate 40 are combined with other through a seal 45 and an in-plane spacer not illustrated, so that the first orientation film 41 of the thin film transistor substrate 10 faces to the second orientation film 41 of the opposite substrate 40, and also that the thin film transistor substrate 10 and the opposite substrate 40 are distanced from each other to form an inter-space defined between the thin film transistor substrate 10 and the opposite substrate 40. The seal 45 may typically comprise, but not limited to, an epoxy resin adhesive. The in-plane spacer may typically comprise, but not limited to, particles of a plastic.

A liquid crystal 46 is injected into the inter-space defined between the thin film transistor substrate 10 and the opposite substrate 40. An opening of the seal 45, form which the liquid crystal 46 has been injected, is then sealed with a sealing agent. The sealing agent may typically comprise, but not limited to, an UV-thermosetting acrylate resin. First and second polarization plates 47 are adhered to outer surfaces of the transparent insulating substrates 20 and 50, thereby completing a liquid crystal panel.

A tape carrier package (TCP) for connection to a driver circuit is pressure-welded to the scanning line terminal 14 and the signal line terminal 15, thereby completing a liquid crystal display.

The following descriptions will focus on a composition of the above-described first etchant used in the above-described first etching process for etching the aluminum-containing top layer laminated on the insulating film or the oxide film on the surface of the chromium-containing bottom layer. FIG. 7 shows the dependency of a taper angle of a tapered aluminum-neodymium (Al—Nd) alloy film wet-etched by an etchant, upon concentrations of nitric acid and acetic acid included in the etchant in addition to 60 percents by weight of phosphoric acid. The tapered angle is defined to be "θ" shown in FIG. 2G. A mark "○" represents that the taper angle "θ" is approximately 30 degrees. Another mark "□" represents that the taper angle "θ" is approximately 45 degrees. Still another mark "Δ" represents that the taper angle "θ" is approximately 60 degrees. Yet another mark " " represents that the taper angle "θ" is ranged approximately 80 degrees to approximately 90 degrees. FIG. 7 demonstrates that if the sum of both the concentrations of nitric acid and acetic acid is at least 16 percents by weight, then the taper angle is at most approximately 60 degrees. The dependency, shown in FIG. 7, of the taper angle upon both the concentrations of nitric acid and acetic acid is independent from the concentration of phosphoric acid. It was also confirmed that almost the same dependencies as shown in FIG. 7 of the taper angle upon both the concentrations of nitric acid and acetic acid are established at different phosphoric acid concentrations of 70 percents by weight, 60 percents by weight and 40 percents by weight. The concentration of phosphoric acid provides a substantive influence only to the etching rate of etching the aluminum-containing top layer, but no influence to the taper angle of the etched aluminum-containing top layer.

Nitric acid acts to reduce an adhesiveness between the resist pattern and the aluminum-containing top layer. The increase in the concentration of nitric acid decreases the taper angle of the etched aluminum-containing top layer. Acetic acid is added into the etchant as a buffer. Notwithstanding, acetic acid also acts to reduce the adhesiveness between the resist pattern and the aluminum-containing top layer. The increase in the concentration of acetic acid decreases the taper angle of the etched aluminum-containing top layer.

Consequently, if the sum of both the concentrations of nitric acid and acetic acid included together with phosphoric acid in the first etchant used for wet-etching the aluminum-containing top layer is at least 16 percents by weight, then the desired taper angle of the etched aluminum-containing top layer is obtained.

In accordance with the present invention, as described above, the presence of the insulating film 3, for example, the oxide film between the first metal film 2, for example, the chromium-containing bottom layer and the second metal film 4, for example, the aluminum-containing top layer suppresses or reduces the above-described undesired hetero-metal-contact-potential-difference between the first metal film 2, for example, the chromium-containing bottom layer and the second metal film 4, for example, the aluminum-containing top layer, resulting in almost no substantive inhibition to the second wet etching process for the first metal film 2, for example, the chromium-containing bottom layer.

After the first etching process for etching the second metal film 4 has been completed, the used resist mask 5 is then removed, before the second etching process for etching the insulating film 3, for example, the oxide film and the first metal film 2 will be made using the taper-etched second metal film 4 as the mask. This does not cause that the resist mask 5 is peeled by an undesired infiltration of the second etchant into an interface between the resist mask 5 and the second metal film 4 during the second etching process for etching the insulating film 3 and the first metal film 2.

It is preferable that the sum of both the concentrations of nitric acid and acetic acid included together with phosphoric acid in the first etchant used for wet-etching the aluminum-containing top layer is at least 16 percents by weight, then the desired taper angle of the etched aluminum-containing top layer is obtained.

In accordance with the above-described embodiment, the thin film transistor of the liquid crystal display has the reverse-staggered thin film transistor. The above-described novel method of forming the lamination film pattern is applied to the gate electrode, the scanning line, the source electrode, the drain electrode, and the signal line. Notwithstanding, typical examples, to which the above-described novel method of forming the lamination film pattern is also applicable, may include, but not limited to, the gate electrode and the scanning line of a forward-staggered thin film transistor as well as reflecting electrodes of reflective or semi-transmitting liquid crystal display. Typical examples of the switching device may include, but not limited to, a polysilicon thin film transistor and a metal-insulator-metal transistor. The lamination film structure of the chromium-containing bottom layer and the aluminum-containing top layer may be used to improve an ohmic contact with an underlying transparent conductive film and an underlying metal film which extend under the lamination film structure.

Typical examples of the resist pattern may include a photo-resist pattern, an X-ray resist pattern and an electron beam resist pattern.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of forming an electrically conductive lamination pattern, said method including the steps of:
    forming an insulating film on a surface of a chromium-containing bottom layer;
    forming an aluminum-containing top layer over said insulating film, so that said insulating film separates said aluminum-containing top layer from said chromium-containing bottom layer;
    carrying out a first selective wet etching process for selectively etching said aluminum-containing top layer with a first etchant; and
    carrying out a second selective wet etching process for selectively etching said chromium-containing bottom layer with a second etchant in the presence of said insulating film which suppresses a hetero-metal-contact-potential-difference between said chromium-containing bottom layer and said aluminum-containing top layer during said second selective wet etching process.

2. The method as claimed in claim 1, wherein said first selective wet etching process is carried out by using a resist pattern over said aluminum-containing top layer.

3. The method as claimed in claim 2, further including the step of removing said resist pattern after said first selective wet etching process has been completed, so that said second selective wet etching process is carried out by using, as a mask, said aluminum-containing top layer wet-etched in said first selective wet etching process.

4. The method as claimed in claim 1, wherein said insulating film comprises an oxide film formed by an oxidation process to said surface of said chromium-containing bottom layer.

5. The method as claimed in claim 4, wherein said oxidation process to said surface of said chromium containing bottom layer comprises an $O_2$ plasma process.

6. The method as claimed in claim 4, wherein said oxidation process to said surface of said chromium-containing bottom layer comprises a reactive sputtering process.

7. The method as claimed in claim 4, wherein said oxidation process to said surface of said chromium-containing bottom layer comprises an anneal process.

8. The method as claimed in claim 1, wherein said insulating film has a thickness in the range of 5 nanometers to 50 nanometers.

9. The method as claimed in claim 1, wherein said first etchant comprises a mixture of a phosphoric acid, a nitric acid and an acetic acid, where a sum of concentrations of said nitric acid and said acetic acid is at least 16 percent by weight.

10. The method as claimed in claim 1, further including the step of carrying out a selective dry etching process, in addition to said second selective wet etching process, for selectively etching said chromium-containing bottom layer.

11. The method as claimed in claim 10, further including the step of removing a dry etching gas from a surface of said aluminum-containing top layer after said selective dry etching process using said dry etching gas has been completed.

12. The method as claimed in claim 1, wherein said chromium-containing bottom layer comprises one of a chromium layer and a chromium alloy layer, and said aluminum-containing top layer comprises one of an aluminum layer or an aluminum alloy layer.

13. The method as claimed in claim 1, wherein said electrically conductive lamination pattern is formed over a substrate for a liquid crystal display panel.

14. A method of forming an electrically conductive lamination pattern, said method including the steps of:
    forming a chromium-containing bottom layer over a substrate;
    forming an aluminum-containing top layer over an insulating film, so that said insulating film separates said aluminum-containing top layer from said chromium-containing bottom layer;
    forming a resist pattern over said aluminum-containing top layer;
    carrying out a first selective wet etching process for selectively etching said aluminum-containing top layer with a first etchant and said resist pattern;
    removing said resist pattern from said aluminum-containing top layer; and
    carrying out a second selective wet etching process for selectively etching said chromium-containing bottom layer with a second etchant and by using, as a mask, said aluminum-containing top layer wet-etched.

15. The method as claimed in claim 14, wherein said first etchant comprises a mixture of a phosphoric acid, a nitric acid and an acetic acid, where a sum of concentrations of said nitric acid and said acetic acid is at least 16 percent by weight.

16. The method as claimed in claim 14, further including the step of forming an insulating film on a surface of said chromium-containing bottom layer before said aluminum-containing top layer is then formed, so that said second selective wet etching process is carried out in the presence of said insulating film which suppresses a hetero-metalcontact-potential-difference between said chromium-containing bottom layer and said aluminum-containing top layer during said second selective wet etching process.

17. The method as claimed in claim 16, wherein said insulating film comprises an oxide film formed by an oxidation process to said surface of said chromium-containing bottom layer.

18. The method as claimed in claim 17, wherein said oxidation process to said surface of said chromium-containing bottom layer comprises an $O_2$ plasma process.

19. The method as claimed in claim 17, wherein said oxidation process to said surface of said chromium-containing bottom layer comprises a reactive sputtering process.

20. The method as claimed in claim 17, wherein said oxidation process to said surface of said chromium-containing bottom layer comprises an anneal process.

21. The method as claimed in claim 16, wherein said insulating film has a thickness in the range of 5 nanometers to 50 nanometers.

22. The method as claimed in claim 14, further including the step of carrying out a selective dry etching process, in addition to said second selective wet etching process, for selectively etching said chromium-containing bottom layer.

23. The method as claimed in claim 22, further including the step of removing a dry etching gas from a surface of said aluminum-containing top layer after said selective dry etching process using said dry etching gas has been completed.

24. The method as claimed in claim 14, wherein said chromium-containing bottom layer comprises one of a chromium layer and a chromium alloy layer, and said aluminum-containing top layer comprises one of an aluminum layer or an aluminum alloy layer.

25. The method as claimed in claim 14, wherein said substrate is a thin film transistor substrate for a liquid crystal display.

* * * * *